(12) United States Patent
Paz et al.

(10) Patent No.: US 6,204,783 B1
(45) Date of Patent: Mar. 20, 2001

(54) DIGITAL TO ANALOG CONVERTOR HAVING A DC OFFSET CANCELLING DEVICE AND A METHOD THEREOF

(75) Inventors: Ronen Paz, Hadera; Vladimir Koifman, Rishon le Zion; Michael Zarubinsky, Jerusalem, all of (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/273,742

(22) Filed: Mar. 22, 1999

(51) Int. Cl.$^7$ ....................................... H03M 1/06
(52) U.S. Cl. ............................. 341/118; 341/144
(58) Field of Search ................... 341/144, 118; 327/350, 307, 362

(56) References Cited

U.S. PATENT DOCUMENTS 5,877,645 * 3/1999 Comino et al. ................... 327/350

* cited by examiner

Primary Examiner—Peguy Jeanpierre
Assistant Examiner—Jean Bruner Jeanglaude

(57) ABSTRACT

A device and a method for canceling DC offset resulting from digital to analog conversion, wherein the device is coupled to a digital to analog comparator (i.e.—DAC), the device comprising of: an adder, coupled to the DAC, for adding a digital input signal IN(n) to a compensation signal CS(w−1), and sending the sum of IN(n) CS(w−1) to the DAC. An analog comparator, coupled to the DAC, for sampling the output signal OUT(t) of the DAC, for comparing the sampled signal ACS(n) to a first reference voltage VREF and for outputting a signal ACO(n) which represents the result of the comparison between ACS(n) and VREF. A DAC emulator, coupled to the DAC, for compensating for a time lapse between the appearance of a digital input signal IN(n) appearing at the input of the adder and an OUT(t), wherein OUT(t) resulted from IN(n). A digital comparator for receiving the output signals DES(n) of the DAC emulator, comparing DES(n) to a second reference value DREF and outputting a signal DCO(n) which represents the result of the comparison between DES(n) to DREF, and an offset calculation unit, coupled to the analog comparator and to the digital comparator for comparing ACO(n) and DCO(n) and sending to the adder, a compensation signal CS(n) which represents the result of the comparison between ACO(n) and DCO(n). The analog and digital comparator are driven by a clock signal which is not correlated to IN(n).

16 Claims, 4 Drawing Sheets

DIGITAL TO ANALOG CONVERTOR HAVING A DC OFFSET CANCELLING DEVICE AND A METHOD THEREOF

FIELD OF THE INVENTION

The present invention relates generally to a digital to analog converter having a device for canceling DC offset resulting from digital to analog conversion, and a method thereof, based on a comparison between a digital input signal and an analog output signal.

BACKGROUND OF THE INVENTION

A digital to analog converter (i.e.—DAC) converts digital signals to analog signals. An analog output signal is comprised of two signals—the first signal is proportional to the digital input signal, and the second signal is an erroneous Direct Current (DC) offset (i.e.—offset). The offset varies when the temperature of the digital to analog converter varies, thus there is a need to compensate the offset constantly.

There is a need to compensate the DC offset in an efficient and fast manner.

BRIEF DESCRIPTION OF THE DRAWINGS

While the invention is pointed out with particularity in the appended claims, other features of the invention are disclosed by the following detailed description taken in conjunction with the accompanying drawings, in which:

DETAILED DESCRIPTION OF THE DRAWINGS

It should be noted that the particular terms and expressions employed and the particular structural and operational details disclosed in the detailed description and accompanying drawings are for illustrative purposes only and are not intended to in any way limit the scope of the invention as described in the appended claims.

Figure 1:
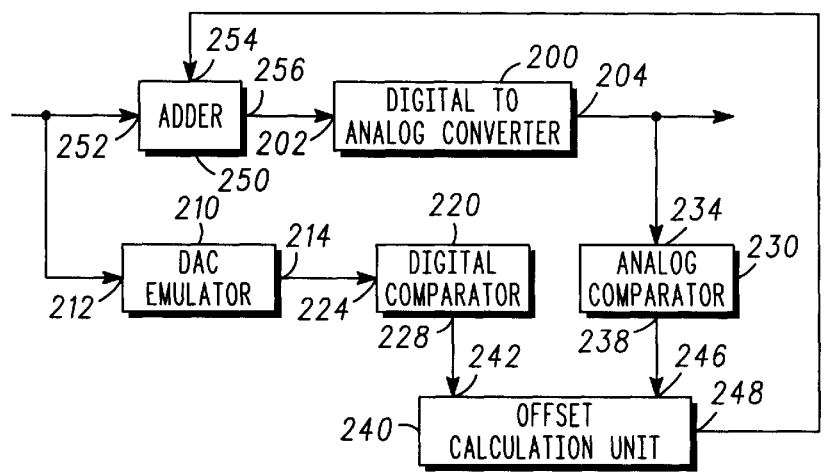
FIG. 1 is a schematic description of an offset cancellation device, coupled to a digital to analog converter, according to a preferred embodiment of the invention.
Figure 2:
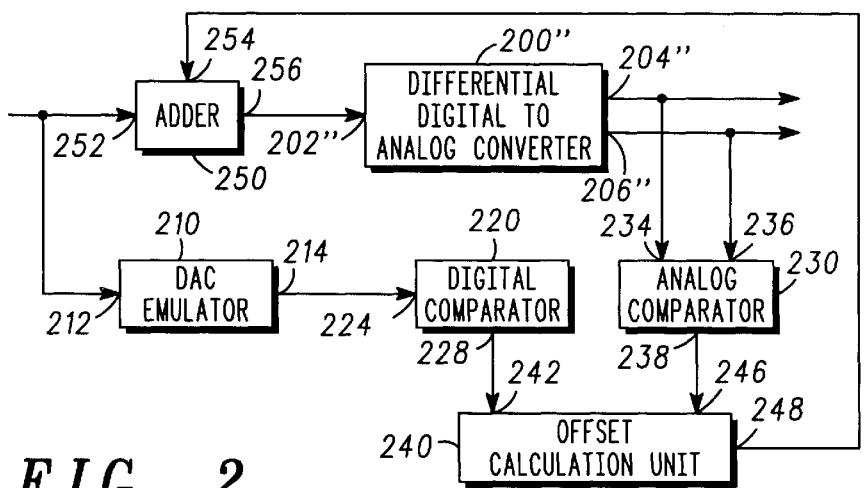
FIG. 2 is a schematic description of an offset cancellation device, coupled to a differential—output digital to analog converter, according to a preferred embodiment of the invention.

FIG. 1 is a schematic description of an offset cancellation device 280 coupled to a digital to analog converter 200, according to a preferred embodiment of the invention. FIG. 2 is a schematic description of an offset cancellation device 280 coupled to a differential—output digital to analog converter 200", according to a preferred embodiment of the invention. FIG. 3–6 are a set of timing diagrams of digital input signal (i.e.—IN(n)) 30 and an analog output signal (i.e.—OUT(t)) 22. OUT(t) 22 is either the output signal from output 204 of DAC 200 or the difference between the two output signals from outputs 204" and 206" of DDAC 200". For convenience of explanation, it is assumed that the DAC 200 and DDAC 200" do not amplify IN(n) 30, thus both IN(n) 30 and OUT(t) 22 are shown on the same scale.

Offset cancellation device 280 is comprised of: adder 250, DAC emulator (i.e.—emulator) 210, digital comparator 220, analog comparator 230 and offset calculation unit 240.

Adder 250 has inputs 252 and 254. Emulator 210 has input 212 and output 214. Analog comparator 230 has inputs 234 and 236 and output 238, and can have an additional input 232. Digital comparator 220 has inputs 224 and 226 and output 228, and can have an additional input 226. Offset calculation unit 240 has inputs 242 and 246 and output 248.

Offset cancellation device 280 is coupled to DAC 200 or to differential DAC 200" (i.e.—DDAC). If offset cancellation device 280 is coupled to DDAC 200", inputs 234 and 236 of analog comparator 230 are coupled to the two differential outputs 204" and 206" of DDAC 200". If offset cancellation device 280 is coupled to DAC 200, then input 234 of analog comparator 230 is coupled to output 204 of DAC 200. Optional inputs 232 and 226 (not shown in FIGS. 1 and 2) of analog comparator 230 and digital comparator 220 can be used to couple analog comparator 230 to a voltage reference VREF, and couple digital comparator to a voltage reference DREF. Usually DREF="0" and VREF=0, and there is no need of these two optional inputs.

For convenience of explanation, it is assumed that offset cancellation device 280 is coupled to DDAC 200". For convenience of explanation, the output signal of emulator 210 is denoted as DES(n) 20, a sampled analog signal within analog comparator 230 is denoted as ACS(n) 24, the output signal of analog comparator 230 is denoted as ACO(n) 26, the output signal of digital comparator 220 is denoted as DCO(n) 28, the output signal of offset calculation unit 240 is denoted as CS(n) 32 and the erroneous DC offset is denoted as OFF(n) 34.

Input 254 of adder 250 is coupled to output 248 of offset calculation unit 240, for receiving CS(w) 32 which compensates OFF(n). Input 252 of adder 250 and input 212 of emulator 210 receive IN(n) 30. The output of adder 250 is coupled to input 202 (202") of DDAC 200", thus DDAC 200" receives CS(w) 32 plus IN(n). CS(w) is the with compensation signal, which resulted from an input signals which was received prior to IN(n). Usually, the calculation of CS(w) lasts many clock cycles. Conveniently, the compensation process stops when the compensation signal remains the same for a long period.

Output 238 of analog comparator 230 and output 228 of digital comparator are coupled to inputs 246 and 242 of offset calculation unit 240. Output 214 of emulator 210 is coupled to input 224 of digital comparator 220. Input 226 of digital comparator is coupled to a digital constant having value of DREF. DREF can be stored in a register, but this is not necessary.

Conveniently, VREF is the analog output signal, which should be outputted by DDAC 200", if IN(n) 30 having value of DREF was inputted to DDAC 200", and if DDAC 200" did not produce any offset or alternatively CS(n)=0. Conveniently, DREF equals the average level of IN(n) 30, and VREF equals the average DC level of OUT(t) 22. For example, DREF="0" and VREF=0 volts when IN(n) 30 is a pseudo-random digital signal which is outputted from baseband filters, within a QPSK modulator, whereas the QPSK modulator is a part of a transmission channel (either a forward or a reverse channel) within a code division multiple access (i.e.—CDMA) transmitter, whereas the average level of IN(n) 30 is zero.

Emulator 250 compensates for a time lapse between appearance of a digital input signal (appearing at input 252 of adder 250) and the analog output signal provided by outputs 204" and 206" of DADD 200", resulting from that digital input signal. Conveniently, emulator 250 is a delay line.

Digital comparator 220 compares the DES(n) to DREF, and if the DES(n)>DREF is outputs a positive pulse (DCO (n)>0), else it outputs a negative pulse (DCO(n)<0).

Analog comparator 230 subtracts the analog signal arriving at input 234 from the analog signal arriving at input 232, and samples the result of the subtraction. Analog comparator 230 compares the sampled signal ACS(n) 24 to VREF. If ACS(n)>VREF, analog comparator 230 outputs a positive pulse (ACO(n)>0), else it outputs a negative pulse (ACO (n)<0).

The comparison done by digital comparator 220 and the sampling performed by analog comparator 230 are activated by a clock signal denoted as SPCLK 34. SPCLK 34 is inputted to inputs 225 and 235 of digital comparator 220 and analog comparator 230 respectively. SPCLK 34 and IN(n) 30 are not be correlated. For example, IN(n) 30 can be a random or pseudo-random signal, while SPCLK 295 can be a periodical signal, or vice verse, both signals can also be random or pseudo-random signals. IN (n) 30 can be a pseudo-random digital signal which is outputted from baseband filters, within a QPSK modulator, whereas the QPSK modulator is a part of a transmission channel (either a forward or a reverse channel) within a code division multiple access (i.e.—CDMA) transmitter.

As used herein, IN(n) 30 "crosses" DREF when its value changes from a first value to a second value, whereas the first value is greater then DREF, while the second value is equal or smaller than DREFF, or vice verse.

Figure 3:
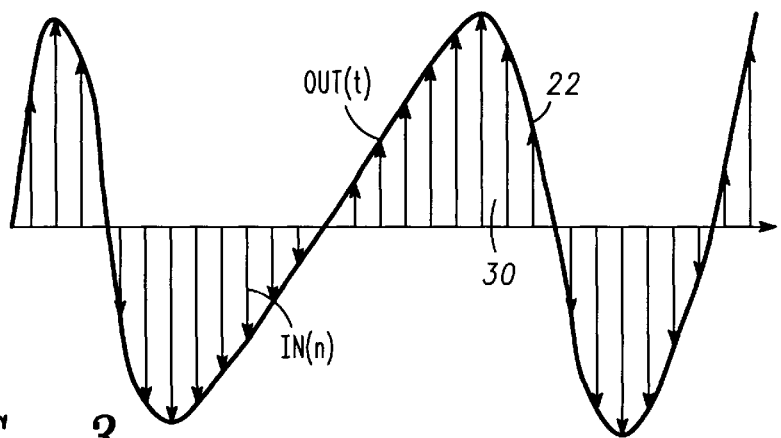
FIGS. 3–6 are a set of timing diagrams of a digital input signal and an analog output signal.
Figure 4:
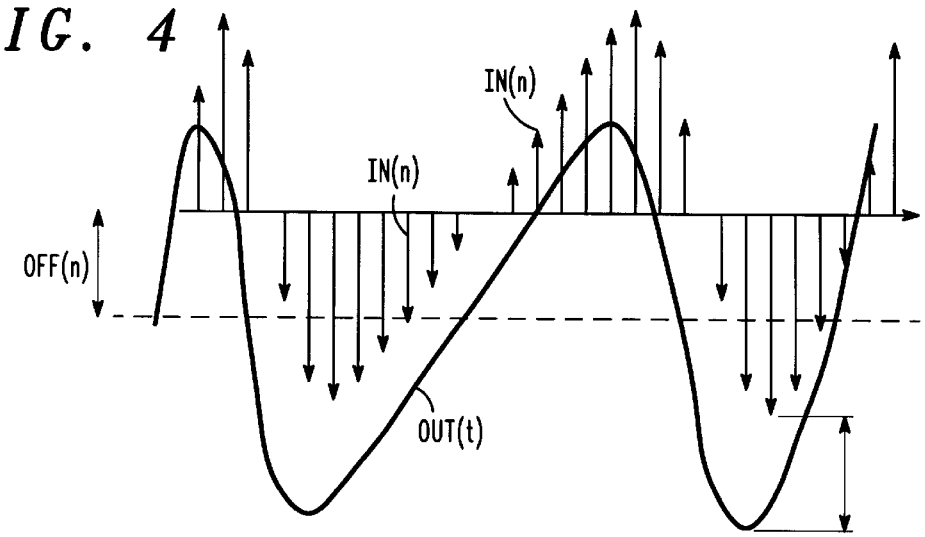
Figure 5A:
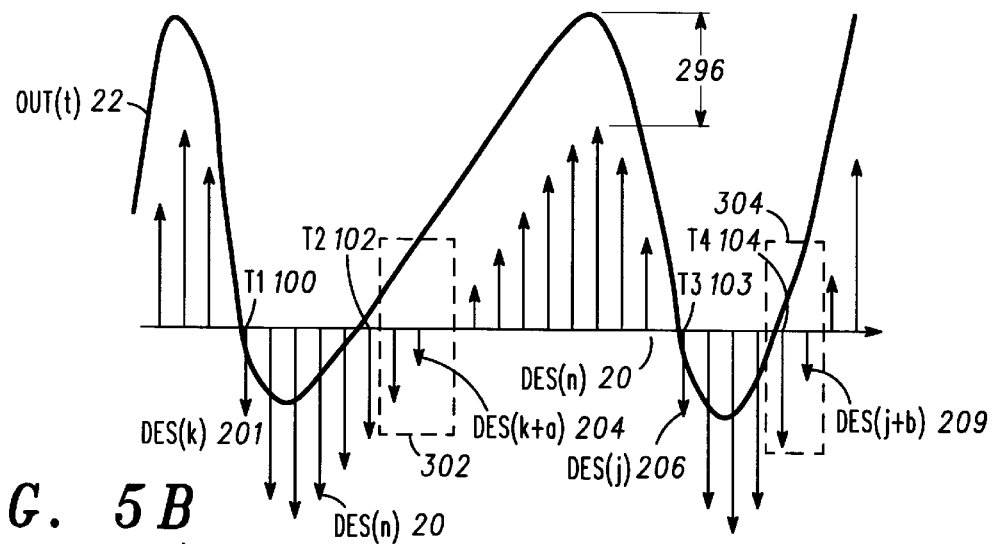
Figure 5B:
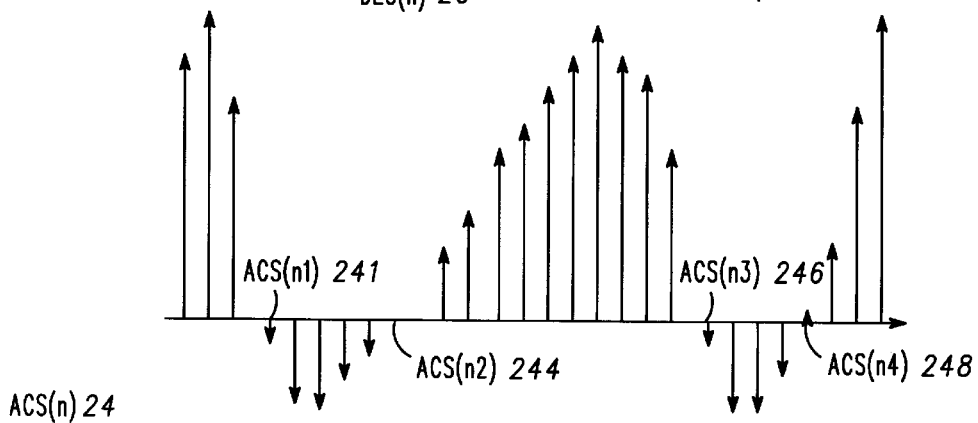
Figure 6A:
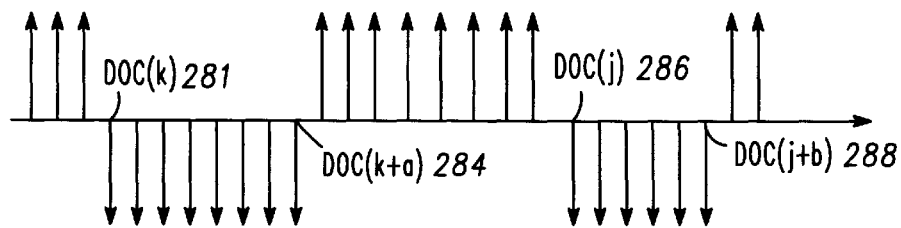
Figure 6B:
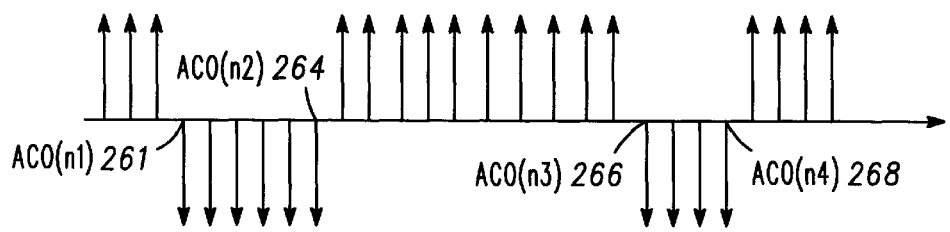

FIG. 3 is a timing diagram of IN(n) 30 and OUT(t) 33 whereas OFF(n) =0. FIG. 4 is a timing diagram of IN(n) 30 and OUT(t) 22, whereas the OFF(n) 34 is constant and OUT(t)<IN(n). FIG. 5 is a timing diagram of IN(n) 30 and OUT(t) 22, whereas the OFF(n) 34 is constant and OUT(t) >IN(n). FIG. 6 is a timing diagram of DCO(n) and ACO(n).

Refer now to FIG. 5 and 6, offset 296 causes IN(n) 30 to be below DREF for a shorten period than OUT(t) 22 is below VREF. OUT(t) 22 crosses VREF at first time (i.e.— T1) 100, at second time (i.e.—T2) 102, at third time (i.e.— T3) 103 and at fourth time (i.e.—T4) 104. Between T1 100 and T2 102 and between T3 103 and T4 104 OUT(t)<VREF, thus ACS(n1) 241 to ACS(n2) 244 and ACS(n3) 246 to ACS(n4) are smaller than VREF. ACS(n2) 244 and ACS(n3) 246 to ACS(n4) cause analog comparator 230 to output negative pulses ACO(n1) 261 to ACO(n2) 264 and ACO(n3) 266 to ACO(n4) 268.

DES(k) 201 to DES(k+a) 204 and DES(j) 206 to DES(j+ b) 209 are below DREF. DES(k) 201 to DES(k+a) 204 and DES(j) 206 to DES(j+b) 209 cause digital comparator 220 to output negative pulses DCO(k) 281 to DCO(k+a) 284 and DCO(j) 286 to DCO(j+b) 289.

The miscorrelation between input signal 294 and SPCLK 295 assures that analog comparator 220 and digital comparator 230 sample output signal 292 and input signal 294 near to some of the "crossing points", wherein a cross point is defined as the time.

Because IN(n)<OUT (t), offset calculation unit receives more positive pulses from analog comparator 230 than from digital comparator 220. The difference between the number of positive pluses outputted from digital comparator 220 and the number of positive outputted from digital comparator 230, is denoted delta 312. The magnitude of offset 296 is proportional to delta 310.

For convenience of explanation it is assumed that offset 296 has a positive value. Digital comparator 230 sends less output positive pulses, from output 228 to input 242 of offset cancellation unit 240, than analog comparator 230 sends from output 238 to input 246 of offset cancellation unit 240.

Offset calculation unit 240 receives the pulses from analog comparator 230 and digital comparator 220, calculates delta 310, and measures the period (i.e.—DT 320) in which delta 310 reaches a predetermined threshold (i.e.— DTREF) 312. Offset 296 is proportional to delta 310, and inversely proportional to DT 320. Offset calculation unit sends to input 254 of adder 250 a compensation signal which is proportional to offset 296.

Figure 7:
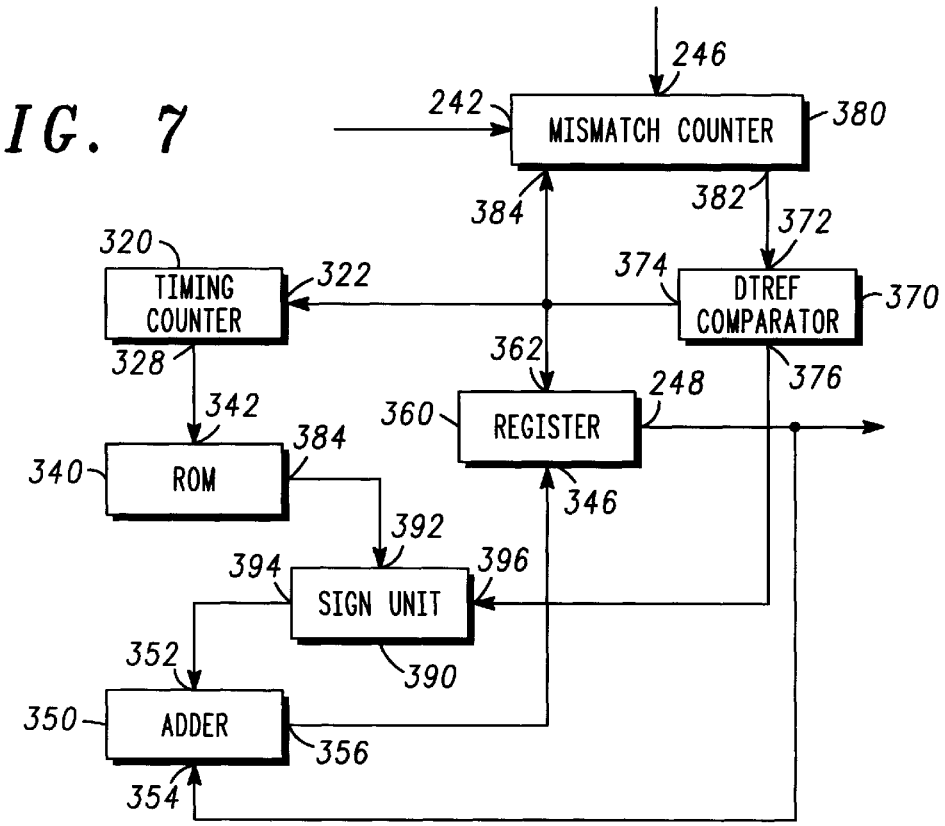
FIG. 7 is a schematic description of an offset calculation unit 240, according to a preferred embodiment of the invention.

FIG. 7 is a schematic description of an offset calculation unit 240, according to a preferred embodiment of the invention.

Offset calculation unit 240 is comprised of: mismatch counter 380, timing counter 320, DTREF comparator 370, memory bank 340 register 360, adder 350 and sign unit 390. Mismatch counter 380 has inputs 242, 246 and 384 and output 382. DTREF comparator 370 has input 372 and outputs 374 and 376. Timing counter 320 has input 322 and output 328. Memory bank 340 has input 342 and output 348. Adder 350 has inputs 354 and 352 and output 356. Sign unit 390 has inputs 392 and 396 and output 394. Output 382 of mismatch counter is coupled to input 372 of DTREF comparator 370. Output 374 of DTREF comparator 370 is coupled to input 322 of timing counter 320, to input 384 of mismatch counter 380 and to input 362 of register 360. Output 328 of timing counter 320 is coupled to input 342 of memory bank 340. Output 348 of memory bank 340 is coupled to input 392 of sign unit 390. Output 394 of sign unit 390 is coupled to input 352 of adder 250. Output 376 of DTREF comparator 370 is coupled to input 396 of sign unit 390. Output 356 of adder 350 is coupled to input 364 of register 360. Output 248 of counter 360 is coupled to input 354 of adder 350.

Mismatch counter 380 receives the output pulses from digital comparator 220 and from analog comparator 230 in inputs 242 and 246 accordingly. A positive pulse which is received in input 242 causes mismatch counter 380 to count up, while a positive pulse at input 246 causes mismatch counter 380 to count down, thus delta 310 is provided by the output signal from output 382 of mismatch counter 380. This output signal is sent to DTREF comparator 370, via input 370. DTREF comparator 370 sends a first and second positive pulse, via outputs 374 and 376 respectively, whenever the delta 310 is bigger than DTREF 312. DTREF comparator 370 sends a first positive pulse and a second negative pulse, via outputs 374 and 376 respectively, whenever the delta 310 is smaller than –(DTREF) 312. The second pulse is sent to sign unit 390. If sign unit 390 receives a positive pulse at input 396 its output signal equals the signal inputted in input 392, thus the output signal of adder 350 equals the output signal provided by memory bank 340 plus the output signal provided by register 360 (i.e.—CS (w-1)). If sign unit 390 receives a negative pulse at input 396, its output signal equals the signal inputted in input 392, thus the output signal of adder 350 equals the output signal provided by memory bank 340 plus the output signal provided by register 360.

Whenever the absolute value of delta 310 is bigger than DTREF 312, offset calculation unit 240 calculates DT(w) 320 by reading the content of timing counter 320. DT(w) 320 determines the value of the compensation signal outputted by offset calculation unit. The output signal from timing counter is used as an address word, which determines which memory word of memory bank 340 shall e sent to adder 350. Memory bank 340 is comprised of N memory words, wherein the content of the K'th word is inversely proportional to K, wherein K is an index having values of 1 to N. The pulse outputted from DTREF comparator 370 causes mismatch counter 380 to be reset, it causes timing counter 320 to send its content to memory bank 340, it causes memory bank 340 to send an output signal to input 352 of adder, it causes counter 320 to be reset and it causes register 360 to read the signal provided by output 356 of adder 350.

Figure 8:
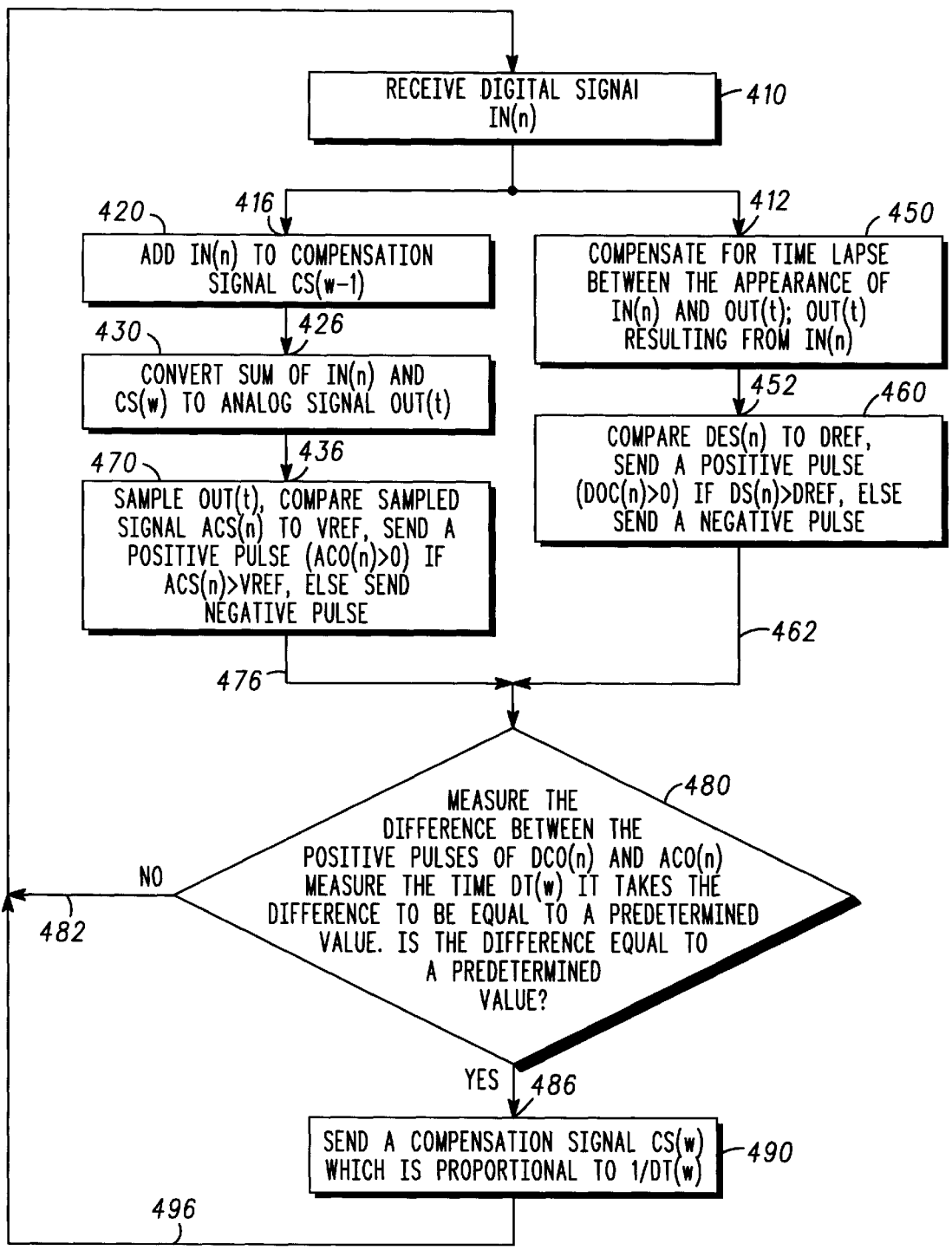
FIG. 8 is a schematic flow chart of a method for canceling DC offsets produced by digital to analog converters.

FIG. 8 is a flow chart of a method 400 for canceling DC offset resulting from digital conversion.

Method 400 comprises of the following steps:

Receiving a digital input signal IN(n) 30, during step 410. As indicated by path 416, step 410 is followed by step 420.

Adding to IN(n) 30 a compensation signal CS(w−1) 32, if w>1, during step 420, wherein CS(w) 32 is the w'th compensation signal, which resulted from input signals which were received prior to IN(n) 30. As indicated by path 426, step 420 is followed by step 430.

Converting the sum of IN(n) 30 and CS(w−1) 32 to an analog signal OUT(t) 22, during step 430. As indicated by path 436, step 430 is followed by step 470.

During step 470, sampling IN(n) 30, producing a sampled signal ACS(n) 24 and comparing ACS(n) 24 to a reference voltage VREF. If ACS(n)>VREF sending a first signal, else sending a second signal. Preferably, sending a positive pulse if ACS(n)>VREF. For convenience of explanation the outputted signal is denoted as ACO(n). As indicated by path 476, step 470 is followed by step 480.

As indicated by paths 412, 452 and 462, step 410 is also followed by steps 450 and 460, thus the step of receiving a digital signal is also followed by the following steps:

Compensating for the time lapse between the appearance of IN(n) and an OUT(t) signal resulting from IN(n), during step 450. Usually, the compensation involves delaying IN(n), thus the outcome of step 450 is a delayed digital signal. For convenience of explanation the signal produced during the execution of this step is denoted as DES(n) 20.

Comparing DES(n) 20 to a reference voltage DREF. If DES(n)>DREF sending a first signal, else sending a second signal. Preferably, sending a positive pulse if DES(n) >DREF. For convenience of explanation the outputted signal is denoted as DCO(n) 28.

As indicated by paths 462, 476, 482, 486 and 496, steps 460 and 470 are followed by the following steps:

Measuring the difference between the number of positive DCO(n) pulses and the number of positive ACO(n) pulses, and measuring the period (DT(w)) it takes this difference (i.e.—delta 310) to arrive to a predetermined value DTREF, during step 480;

Jumping to step 410 for receiving a digital signal, if delta did not reach DTERF, else producing a compensation signal CS(w) 32, during step 490, wherein CS(w) is inversely proportional to DT(w). As indicated by path 496, step 490 is followed by step 410.

Conveniently, steps 480 and 490 can be implemented by using the offset calculation unit 240 described in FIG. 3, wherein this implementation comprising of the following steps:

Receiving DCO(n) 28 and ACO(n) 26 by mismatch counter 380, wherein each positive DCO(n) pulse causes mismatch counter 380 to count up and each positive ACO(n) pulse causes mismatch counter 380 to count down.

Comparing the output signal (i.e.—delta 310) of mismatch counter 380 to DTREF and sending a first and second positive pulse, whenever delta>DTREF 312. Sending a first positive pulse to timing counter 320 and a second negative pulse to sign unit 390, whenever delta 310 is smaller than −(DTREF) 312.

Sending the content (i.e.—DT(w)) of timing counter 320 to memory bank 340 and sending a signal SIGNAL(w), having value which is inversely proportional to 1/DT(w) to sign unit 390.

Sending CS(w) which equals CS(w−1)+SIGNAL(w) if delta>DTREF, else sending CS(w) having value of CS(w−1)−(SIGNAL(w)).

Thus, there has been described herein an embodiment including at least one preferred embodiment of an improved method and apparatus for grouping data processor instructions and embodiments of instruction systems. It will be apparent to those skilled in the art that the disclosed subject matter may be modified in numerous ways and may assume many embodiments other than the preferred form specifically set out and described above. Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

What is claimed is:

1. A device for canceling DC offset resulting from a digital to analog conversion, the device being coupled to a digital to analog converter, the device comprising:

an adder, coupled to the digital to analog converter, for adding a digital input signal to a compensation signal;

an analog comparator, coupled to the digital to analog converter, for sampling the analog output signal provided by the digital to analog converter, and for comparing the sampled analog output signal to a first threshold;

a DAC emulator for receiving the digital input signal and, for compensating for a time lapse between the appearance of the digital input signal at the input of the adder and the appearance of the analog output signal resulting from the digital input signal and the compensation signal;

a digital comparator, coupled to the DAC emulator for comparing the signal provided by the DAC emulator to a second threshold; and an offset calculation unit, coupled to the analog comparator and to the digital comparator, for generating the compensation signal and sending the compensation signal to the adder, wherein the compensation signal reflects the comparisons performed by the digital and analog comparator.

2. The device of claim 1 wherein the sampling performed by the analog comparator and the digital comparator are driven by a clock signal; and wherein the clock signal and the digital input signal are not correlated.

3. The device of claim 2 wherein the offset calculation unit measures a difference between the output signals provided by the analog and digital converters;

wherein the offset calculation unit measures a period in which the difference reaches a third threshold; and wherein the offset calculation unit generates a compensation signal which is proportional to the third threshold and to the period.

4. The device of claim 3 wherein the first and second thresholds are zero.

5. The device of claim 4 wherein the digital input is a random signal, while the clock signal is a periodical signal.

6. The device of claim 5 wherein the device is coupled to a base band filters within a QPSK modulator of a transmission channel of a code division multiple access transmitter.

7. The device of claim 3 wherein the offset calculation unit comprising:

a mismatch counter, coupled to the analog and the digital comparators, for measuring the difference;

a third threshold comparator, coupled to the mismatch counter, for comparing the absolute value of the difference to the third threshold;

a timing counter, coupled to the third threshold comparator, for measuring the period, wherein the timing counter is reset when the absolute value of the difference reaches the third threshold;

a memory bank, coupled to the timing counter, for generating a signal CS(w) which is inversely proportional to the period;

a sign unit, coupled to the memory bank, for generating the signal CS(w) when the difference is positive and generating −CS(w) when the difference is negative;

a register, coupled to the third threshold comparator, for storing the compensation signal of a previous time point, and for outputting a compensation signal of a current time point; and an adder, coupled to the register and to the sign unit, for adding the compensation signal of the previous time point to the signal provided by the adder.

8. An digital to analog converter, having a device for canceling DC offset resulting from digital to analog conversion, the device comprising:

an adder, coupled to the digital to analog converter, for adding a digital input signal to a compensation signal;

an analog comparator, coupled to the digital to analog converter, for sampling the analog output signal provided by the digital to analog converter, and for comparing the sampled analog output signal to a first threshold;

a DAC emulators for receiving the digital input signal, for compensating for a time lapse between the appearance of the digital input signal at the input of the adder and the appearance of the analog output signal resulting from the digital input signal and the compensation signal;

a digital comparator, coupled to the DAC emulator for comparing the signal provided by the DAC emulator to a second threshold;

an offset calculation unit, coupled to the analog comparator and to the digital comparator, for generating the compensation signal and sending the compensation signal to the adder, wherein the compensation signal reflects the comparisons performed by the digital and analog comparator.

9. The digital to analog converter of claim 8 wherein the sampling performed by the analog comparator and the digital comparator are driven by a clock signal; and wherein the clock signal and the digital input signal are not correlated.

10. The digital to analog converter of claim 9 wherein the offset calculation unit measures a difference between the output signals provided by the analog and digital comparators;

wherein the offset calculation unit measures a period in which the difference reaches a third threshold; and wherein the offset calculation unit generates a compensation signal which is proportional to the third threshold and to the period.

11. The digital to analog converter of claim 10 wherein the first and second thresholds are zero.

12. The digital to analog converter of claim 11 wherein the digital input is a random signal, while the clock signal is a periodical signal.

13. The digital to analog converter of claim 12 wherein the device is coupled to a base band filters within a QPSK modulator of a transmission channel of a code division multiple access transmitter.

14. The digital to analog converter of claim 10 wherein the offset calculation unit comprising:

a mismatch counter, coupled to the analog and the digital comparators, for measuring the difference;

a third threshold comparator, coupled to the mismatch counter, for comparing the absolute value of the difference to the third threshold;

a timing counter, coupled to the third threshold comparator, for measuring the period, wherein the timing counter is reset when the absolute value of the difference reaches the third threshold;

a memory bank, coupled to the timing counter, for generating a signal CS(w) which is inversely proportional to the period;

a sign unit, coupled to the memory bank, for generating the signal CS(w) when the difference is positive and generating −CS(w) when the difference is negative;

a register, coupled to the third threshold comparator, for storing a previous compensation signal, and for outputting a current compensation signal; and an adder, coupled to the register and to the sign unit, for adding the previous compensation signal to the signal provided by the adder.

15. A method for canceling DC offsets resulting from converting a digital signal to an analog signal, the method comprising of:

receiving a digital input signal;

performing in parallel two set of steps, wherein the first set of step comprising of:

adding the digital input signal to a compensation signal;

converting the sum of the digital input signal and the compensation signal to an analog output signal;

sampling an analog output signal, and comparing the sampled analog output signal to a first threshold;

wherein the second set of steps comprising of:

generating a delayed digital input signal by compensating for a time lapse between the appearance of the digital input signal and the appearance of the analog output signal, wherein the analog output signal resulting from the conversion of the sum of the digital input signal and the compensation signal;

comparing between the delayed digital input signal and a second threshold:

wherein both sets of steps are followed by generating the compensation signal, the compensation signal reflecting the comparisons between the sampled signal to the first threshold and between the delayed digital input to the second threshold.

16. The method of claim 15 wherein the generation of the compensation signal further comprising:

measuring a difference between the number of times the sampled analog output signal reached the first threshold and the number of times the delayed digital input reached the second threshold;

measuring a period in which the absolute value of the difference reached a third threshold;

adding a previous compensation signal to a signal which is inversely proportional to the period, if the difference is positive; and subtracting a signal which is inversely proportional to the period, if the difference is negative.

* * * * *

UNITED STATES PATENT AND TRADEMARK OFFICE
CERTIFICATE OF CORRECTION

PATENT NO. : 6,204,783 B1
DATED : March 20, 2001
INVENTOR(S) : Ronen Paz et al.

It is certified that error appears in the above-identified patent and that said Letters Patent is hereby corrected as shown below:

Abstract,
Line 6, after "IN(n)" insert -- and --.

Column 7, claim 8,
Line 43, replace "emulators" with -- emulator --.
Line 43, replace "signal," with -- signal and --.

Signed and Sealed this

Sixth Day of November, 2001

*Attest:*

NICHOLAS P. GODICI
*Attesting Officer*     *Acting Director of the United States Patent and Trademark Office*